United States Patent
Champlin

(10) Patent No.: US 6,262,563 B1
(45) Date of Patent: *Jul. 17, 2001

(54) METHOD AND APPARATUS FOR MEASURING COMPLEX ADMITTANCE OF CELLS AND BATTERIES

(76) Inventor: Keith S. Champlin, 5437 Elliot Ave. South, Minneapolis, MN (US) 55417

(*) Notice: Subject to any disclaimer, the term of this patent is extended or adjusted under 35 U.S.C. 154(b) by 0 days.

This patent is subject to a terminal disclaimer.

(21) Appl. No.: 09/503,015

(22) Filed: Feb. 11, 2000

Related U.S. Application Data

(63) Continuation-in-part of application No. 09/454,629, filed on Dec. 3, 1999, now Pat. No. 6,172,483, which is a continuation of application No. 09/152,219, filed on Sep. 11, 1998, now Pat. No. 6,002,238.

(51) Int. Cl.[7] .............................. H02J 7/16; G01N 27/416
(52) U.S. Cl. ................................... 320/134; 320/DIG. 12; 324/430; 702/63; 340/636
(58) Field of Search ........................... 320/134, DIG. 12; 324/430, 426; 702/63; 340/636

(56) References Cited

U.S. PATENT DOCUMENTS

| | | | |
|---|---|---|---|
| 2,514,745 | 7/1950 | Dalzell | 171/95 |
| 3,356,936 | 12/1967 | Smith | 324/29.5 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |

(List continued on next page.)

FOREIGN PATENT DOCUMENTS

| | | |
|---|---|---|
| 0 022 450 A1 | 1/1981 | (EP) . |
| 29 26 716 B1 | 1/1981 | (DE) . |
| 0 637 754 A1 | 2/1995 | (EP) . |
| 0 772 056 A1 | 5/1997 | (EP) . |
| 2 088 159 | 6/1982 | (GB) . |

(List continued on next page.)

OTHER PUBLICATIONS

"Electrochemical Impedance Spectroscopy in Battery Development and Testing", *Batteries International*, Apr. 1997, pp. 59 and 62–63.
"Battery Impedance", by E. Willihnganz et al., *Electrical Engineering*, Sep. 1959, pp. 922–925.
"Determining The End of Battery Life", by S. DeBardelaben, *IEEE*, 1986, pp. 365–368.
"A Look at the Impedance of a Cell", by S. Debardelaben, *IEEE*, 1988, pp. 394–397.

(List continued on next page.)

*Primary Examiner*—Edward H. Tso
*Assistant Examiner*—Gregory J. Toatley, Jr.
(74) *Attorney, Agent, or Firm*—Westman, Champlin & Kelly, P.A.

(57) ABSTRACT

A periodic time-varying current with smallest period $1/f_1$ excites a cell/battery and provides a timing reference. Linear circuitry produces two signals, one proportional to the excitation current, the other proportional to the responding time-varying voltage. These signals are processed with identical frequency-limiting filter characteristics to attenuate higher-order harmonics and noise. Using the timing reference for synchronization, a microprocessor/microcontroller commands analog to digital converters to sample the frequency-limited current and voltage signals at equally-spaced times over a period and accepts the digitized samples as inputs. The digital samples are averaged over multiple periods and employed to calculate averaged Fourier coefficients of in-phase and quadrature components of frequency-limited current and voltage at frequency $f_1$. By numerically combining these Fourier coefficients, the microprocessor/microcontroller determines real and imaginary parts of the cell/battery's complex admittance at frequency $f_1$.

94 Claims, 4 Drawing Sheets

U.S. PATENT DOCUMENTS

| | | | |
|---|---|---|---|
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,390,828 | 6/1983 | Converse et al. | 320/32 |
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell 'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,738 | 6/1990 | MacIntyre et al. | 324/435 |
| 4,947,124 | 8/1990 | Hauser | 324/430 |
| 4,956,597 | 9/1990 | Heavvvvey et al. | 320/14 |
| 4,968,941 | 11/1990 | Rogers | 324/428 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,248 | 9/1992 | Alexandres et al. | 324/428 |
| 5,170,124 | 12/1992 | Blair et al. | 324/434 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,331,268 | 7/1994 | Patino et al. | 320/20 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,426,371 | 6/1995 | Salley et al. | 324/429 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,457,377 | 10/1995 | Jonsson | 320/5 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,585,728 | 12/1996 | Champlin | 324/427 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,717,336 | 2/1998 | Basell et al. | 324/430 |
| 5,757,192 | 5/1998 | McShane et al. | 324/427 |
| 5,773,978 | 6/1998 | Becker | 324/430 |
| 5,789,899 | 8/1998 | van Phuoc et al. | 320/30 |
| 5,793,359 | 8/1998 | Ushikubo | 345/169 |
| 5,821,756 | 10/1998 | McShane et al. | 324/430 |
| 5,831,435 | 11/1998 | Troy | 324/426 |
| 5,872,443 | 2/1999 | Williamson | 320/21 |
| 5,914,605 | 6/1999 | Bertness | 324/430 |
| 5,945,829 | 8/1999 | Bertness | 324/430 |
| 6,002,238 * | 12/1999 | Champlin | 320/134 |
| 6,037,777 * | 3/2000 | Champlin | 324/430 |

FOREIGN PATENT DOCUMENTS

| | | |
|---|---|---|
| 59-017894 | 1/1984 | (JP) . |
| 59-17892 | 1/1984 | (JP) . |
| 59-17893 | 1/1984 | (JP) . |
| 59-17894 | 1/1984 | (JP) . |
| 60-225078 | 11/1985 | (JP) . |
| 03274479 | 12/1991 | (JP) . |
| 03282276 | 12/1991 | (JP) . |
| 04131779 | 5/1992 | (JP) . |
| 04372536 | 12/1992 | (JP) . |

| | | |
|---|---|---|
| 5216550 | 8/1993 | (JP) . |
| WO 93/22666 | 11/1993 | (WO) . |
| WO 98/58270 | 12/1998 | (WO) . |

OTHER PUBLICATIONS

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice for Maintenance, Testings, and Replacement of Large Lead Storage Batteries for Generating Stations and Substations, *The Institute of Electrical and Electronics Engineers, Inc.*, ANSI/IEEE Std. 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

\* cited by examiner

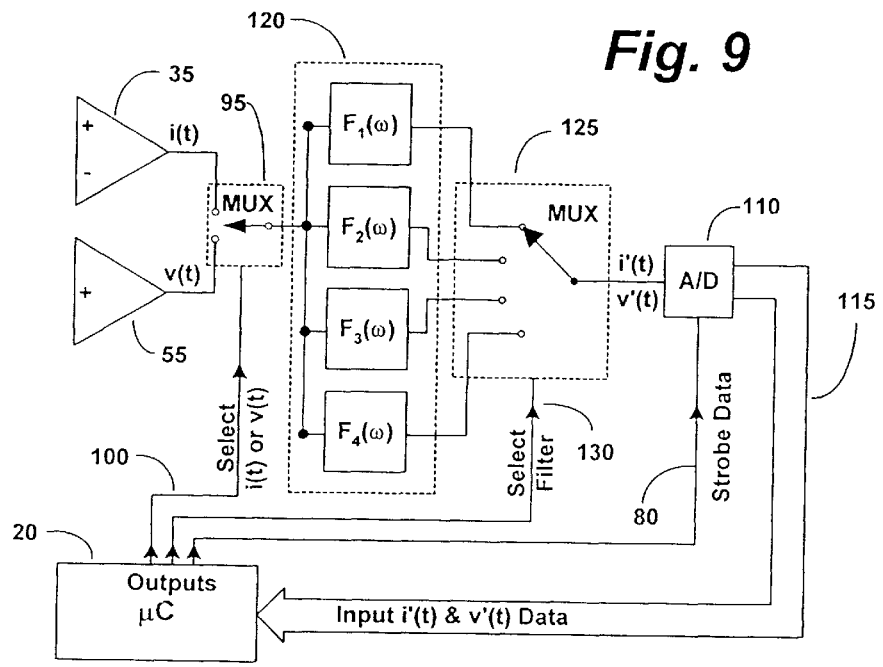
*Fig. 9*
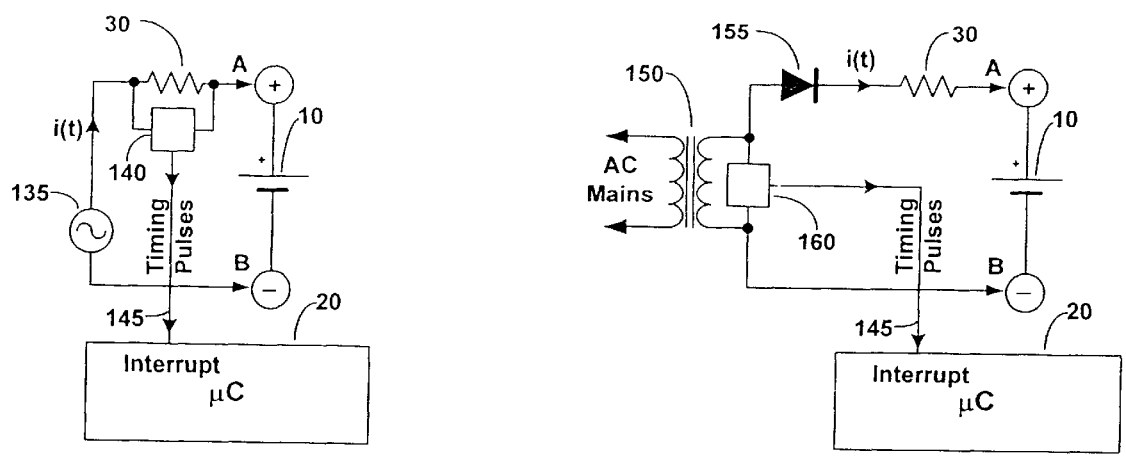
*Fig. 10*  *Fig. 11*

US 6,262,563 B1

METHOD AND APPARATUS FOR MEASURING COMPLEX ADMITTANCE OF CELLS AND BATTERIES

This is a continuation-in-part patent application of U.S. Ser. No. 09/454,629, now U.S. Pat. No. 6,172,483 filed Dec. 3, 1999, which is a continuation application of U.S. Ser. No. 09/152,219, filed Sep. 11, 1998 issued as U.S. Pat. No. 6,002,238 on Dec. 14, 1999.

BACKGROUND OF THE INVENTION

Admittance, the reciprocal of impedance, is a complex quantity. As such, it has two components: either magnitude and phase, or real and imaginary parts (i.e., conductance and susceptance). These alternative forms of complex admittance are equivalent.

Both components of admittance of an electrochemical cell or battery are meaningful. One can gain insight into many properties such as cranking power, state-of-charge, percent capacity, temperature, and physical condition by analyzing measurements of complex admittance obtained at selected "spot" frequencies. Heretofore however, complex admittance—or its reciprocal complex impedance—could only be determined with bridges or expensive laboratory instruments that were poorly suited to measuring batteries in the field (e.g., E. Willihnganz and Peter Rohner, "Battery Impedance", *Electrical Engineering*, 78, No. 9, pp. 922–925, September, 1959; see also David Robinson, "Electrochemical Impedance Spectroscopy in Battery Development and Testing", *BATTERIES INTERNATIONAL*, 31, pp. 59–63, April 1997).

R. S. Robinson, in PCT International Publication WO93/22666, teaches a method for measuring complex impedance of batteries in service. However, the apparatus he discloses is an FFT-based commercial signal analyzer (HP 3562A) and the disclosed method uses existing battery currents as excitation—currents that may not contain the frequency or frequencies desired.

Devices for measuring battery impedance/admittance described in the patent literature have been generally limited to apparatus that actually determines only one quantity. For example, patent references can be found for field apparatus that purports to measure battery impedance (e.g., U.S. Pat. No. 4,697,134 to Burkum et al, U.S. Pat. No. 5,773,978 to Becker) and battery resistance (e.g., U.S. Pat. No. 3,753,094 to Furuishi, U.S. Pat. No. 3,676,770 to Sharaf et al, U.S. Pat. No. 5,047,722 to Wurst et al). Furthermore, apparatus for measuring battery conductance has been disclosed by Champlin in U.S. Pat. Nos. 3,873,911; 4,816,768; 5,140,269; and 5,572,136. However, none of these patents disclose apparatus that measures two quantities. The present patent addresses this deficiency by disclosing a practical method, and its apparatus implementation, for accurately measuring real and imaginary parts of cell/battery admittance under actual field conditions—conditions that often include a high degree of electrical noise.

SUMMARY OF THE INVENTION

A periodic time-varying current excites a cell/battery and provides a timing reference. This current excitation need not be sinusoidal but need only be periodic with its smallest period equal to $1/f_1$, where $f_1$ is the desired measurement frequency. Linear circuitry senses two signals, one proportional to the time-varying excitation current, the other proportional to the responding time-varying component of battery voltage. The two signals are processed with identical frequency-limiting filter characteristics to attenuate higher-order harmonics and noise. Using the timing reference for synchronization, a microprocessor or microcontroller commands analog to digital converters to sample the frequency-limited current and voltage signals at evenly spaced times over a period of the excitation and accepts the digitized samples as inputs. It then averages these samples over multiple periods and calculates averaged Fourier coefficients of in-phase and quadrature components of frequency-limited current and voltage at frequency $f_1$. Finally, the microprocessor/microcontroller combines the four averaged Fourier coefficients numerically to evaluate real and imaginary parts of the cell/battery's complex admittance at frequency $f_1$. The disclosed method and apparatus are quite inexpensively implemented and give very accurate results under typical field conditions—even under conditions of extreme electrical noise.

BRIEF DESCRIPTION OF THE DRAWINGS

FIG. 4b is a waveform plot of the battery's time-varying voltage response to the current excitation depicted in FIG. 4a.

FIG. 5a is a waveform plot of the time-varying signal at the output of a low-pass filter whose input signal is the waveform depicted in FIG. 4a.

FIG. 6a is a waveform plot of the time-varying signal at the output of a band-pass filter whose input signal is the waveform depicted in FIG. 4a.

FIG. 9 depicts a block diagram of a particular variation of the invention embodiments disclosed in FIGS. 7 and 8.

FIG. 10 depicts a block diagram of another variation of the invention embodiments disclosed in FIGS. 7 and 8.

FIG. 11 depicts a block diagram of still another variation of the invention embodiments disclosed in FIGS. 7 and 8.

DETAILED DESCRIPTION OF THE PREFERRED EMBODIMENTS

Figure 1:
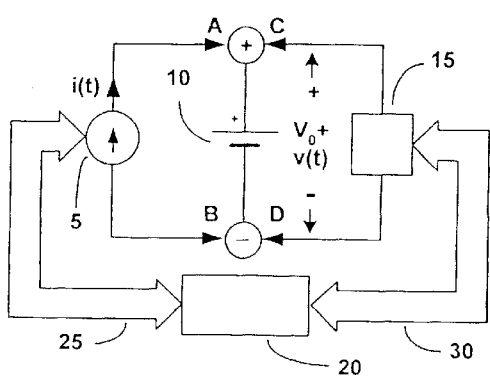
FIG. 1 is a schematic representation of the basic elements employed to determine complex admittance of a cell or battery in accordance with the present invention.

FIG. 1 discloses the basic elements employed to determine real and imaginary parts of complex admittance of an electrochemical cell or battery in accordance with the present invention. Current excitation and processing circuitry 5 excites a periodic time-varying current i(t) that is coupled to cell/battery 10 by current-coupling contacts A and B. A responding periodic time-varying voltage $V_0+v(t)$ across cell/battery 10 couples to voltage sensing and processing circuitry 15 through voltage-coupling contacts C and D. Current excitation and processing circuitry 5 and voltage sensing and processing circuitry 15 each communicate bilaterally with computation and control circuitry 20 via communication paths 25 and 30, respectively.

Current excitation and processing circuitry 5 may comprise an oscillator or other active circuit that generates a periodic ac current signal. Alternatively, circuitry 5 may comprise circuitry for simply modulating the cell/battery's own dc discharge or charge current in a periodic manner. In its simplest form i(t) comprises a single sinusoidal ac component at the discrete frequency $f_k$ having amplitude $\Delta I_k$, along with a possible dc component $I_0$.

$$i(t) = I_0 + \Delta I_k \sin(2\pi f_k t) \tag{1}$$

Figure 2A:
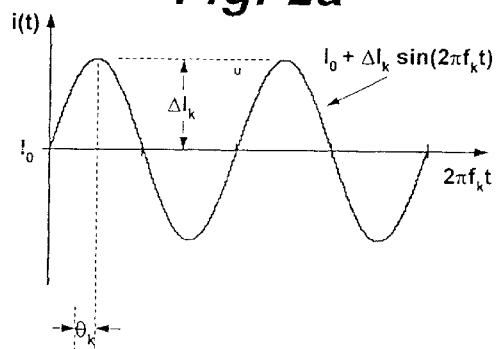
FIG. 2a is a waveform plot of a simple excitation current $i(t)$ of FIG. 1 showing a dc component $I_0$ and a sinusoidally-varying ac component $\Delta I_k \sin(2\pi f_k t)$.

This waveform is illustrated in FIG. 2a. In a more general case, i(t) comprises a composite multi-frequency signal, and the ac term in (1) represents a single sinusoidal component of i(t) at frequency $f_k$. The dc term $I_0$ need not be present. However, if present, positive $I_0$ corresponds to a modulated charging current and negative $I_0$ corresponds to a modulated discharging current according to the convention defined in FIG. 1.

For small signals, the response to sinusoidal excitation is also sinusoidal at the same frequency. Thus, the cell/battery voltage under current excitation of the form of equation (1) can be written $V_0+v(t)$ where $V_0$ is the dc terminal voltage and v(t) is given by $$v(t) = \Delta V_k \sin(2\pi f_k t + \theta_k). \tag{2}$$

Figure 2C:
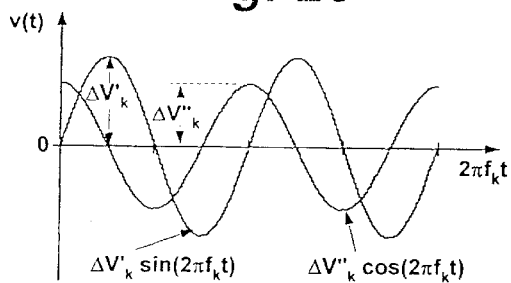
FIG. 2c is a plot of an alternative representation of $v(t)$ showing a sinusoidally-varying ac component $\Delta V'_k \sin(2\pi f_k t)$ that is in time-phase with the ac component of $i(t)$ and a sinusoidally-varying ac component $\Delta V''_k \cos(2\pi f_k t)$ that is 90 degrees out of time-phase with the ac component of $i(t)$.
Figure 2B:
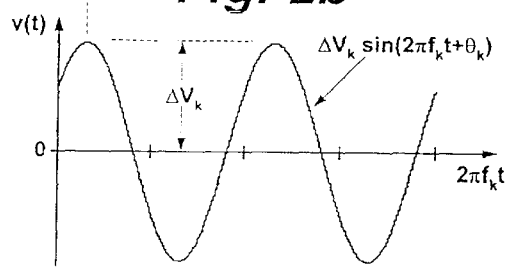
FIG. 2b is a waveform plot of the ac response $v(t)$ showing a sinusoidally-varying ac component $\Delta V_k \sin(2\pi f_k t + \theta_k)$.

FIG. 2b illustrates this waveform. The ac response voltage v(t) has amplitude $\Delta V_k$ and differs in time-phase from the ac component of i(t) by the phase angle $\theta_k$. In the more general case of multi-frequency excitation, equation (2) represents a single sinusoidal component of v(t) at frequency $f_k$.

An alternative representation of v(t), illustrated in FIG. 2c, is $$v(t) = \Delta V'_k \sin(2\pi f_k t) + \Delta V''_k \cos(2\pi f_k t) \tag{3}$$

in which the ac response voltage has been divided into two sinusoidal components. One component, $\Delta V'_k \sin(2\pi f_k t)$, is in time-phase with the ac component of i(t). The other, $\Delta V''_k \cos(2\pi f_k t)$, is in time-quadrature, or 90 degrees out of time-phase, with the ac component of i(t). By using a well-known trigonometric identity, one can show that the two equivalent representations are related by $$\Delta V'_k = \Delta V_k \cos(\theta_k) \tag{4}$$

and $$\Delta V''_k = \Delta V_k \sin(\theta_k). \tag{5}$$

The complex admittance at frequency $f_k$ is defined as $$Y(f_k) = G(f_k) + jB(f_k) = \frac{\Delta I_k}{\Delta V'_k + j\Delta V''_k} \tag{6}$$

where $j = \sqrt{-1}$. The real part of the complex admittance, $G(f_k)$, is the battery's conductance at frequency $f_k$. The imaginary part, $B(f_k)$, is the battery's susceptance at frequency $f_k$.

The discussion leading to equation (6) assumes that the ac current signal varies as $\sin(2\pi f_k t)$ and therefore has zero phase. However, the definition of complex admittance can be easily extended to the more general case in which both current and voltage are shifted by an arbitrary phase angle $\Phi$ from a reference zero-phase signal, $\sin(2\pi f_k t)$. By analogy with equations (4) and (5), one can write $$I'_k = \Delta I_k \cos(\Phi) \tag{7}$$

$$I''_k = \Delta I_k \sin(\Phi) \tag{8}$$

$$V'_k = \Delta V_k \cos(\Phi + \theta_k) \tag{9}$$

$$V''_k = \Delta V_k \sin(\Phi + \theta_k) \tag{10}$$

in which $I'_k$ and $I''_k$ are amplitudes of current components that are in time-phase and in time-quadrature, respectively, with the reference zero-phase signal; and $V'_k$ and $V''_k$ are amplitudes of voltage components that are in time-phase and in time-quadrature, respectively, with the reference zero-phase signal. The complex admittance is then written as the complex ratio $$Y(f_k) = G(f_k) + jB(f_k) = \frac{I'_k + jI''_k}{V'_k + jV''_k}. \tag{11}$$

Separating equation (11) into its real and imaginary parts leads to $$G(f_k) = \frac{I'_k V'_k + I''_k V''_k}{V'^2_k + V''^2_k} \text{ and} \tag{12}$$

$$B(f_k) = \frac{I''_k V'_k - I'_k V''_k}{V'^2_k + V''^2_k}. \tag{13}$$

Equations (11), (12), and (13) are more general than equation (6) since they permit both i(t) and v(t) to be shifted in time-phase by an arbitrary angle $\Phi$. However, the definition of complex admittance, equation (6), shows that $Y(f_k)$ is independent of $\Phi$. Thus, although phase shift $\Phi$ affects values of $I'_k$, $I''_k$, $V'_k$ and $V''_k$, it has no effect on the determination of $G(f_k)$ and $B(f_k)$ as long as the phase shift is common to both i(t) and v(t). As will be seen below, this fact is of fundamental importance to my invention.

In the more general case of periodic excitation of the form $i(t) = i(t+T)$, where T is the smallest period, the current is given by a Fourier series $$i(t) = I_0 + \sum_{k=1}^{\infty} \{I'_k \sin(2\pi k f_1 t) + I''_k \cos(2\pi k f_1 t)\} \tag{14}$$

in which $f_1 = 1/T$ is the fundamental frequency of the excitation, and $kf_1 = f_k$ is the $k^{th}$ harmonic frequency. If, as will be assumed herein, the excitation waveform also has the half-period symmetry property $$\{i(t)-I_0\}=-\{i(t+T/2)-I_0\} \quad (15)$$

only odd harmonics (i.e., 1, 3, 5, . . . ) exist in equation (14).

According to the well-known theory of Fourier analysis, the quantities $I'_k$ and $I''_k$ are Fourier coefficients of the excitation current and are given by the integrals $$I'_k = \frac{2}{T}\int_0^T i(t)\sin(2\pi k f_1 t)\,dt \text{ and} \quad (16)$$

$$I''_k = \frac{2}{T}\int_0^T i(t)\cos(2\pi k f_1 t)\,dt. \quad (17)$$

One sees from equation (14) however, that $I'_k$ and $I''_k$ also represent amplitudes of current components that are in time-phase and in time-quadrature, respectively, with a reference zero-phase signal at frequency $f_k=kf_1$. The timing of this reference signal, and hence the relative sizes of $I'_k$ and $I''_k$, is determined arbitrarily by the point in the periodic waveform i(t) that is chosen to be t=0 when evaluating equations (16) and (17).

For small signals, the voltage response to current excitation of the form of equation (14) is another Fourier series containing only odd harmonic terms. This ac voltage response is given by $$v(t) = \sum_{k=1}^{\infty}\{V'_k\sin(2\pi k f_1 t) + V''_k\cos(2\pi k f_1 t)\}. \quad (18)$$

The quantities $V'_k$ and $V''_k$ are Fourier coefficients of the response voltage and are given by the integrals $$V'_k = \frac{2}{T}\int_0^T v(t)\sin(2\pi k f_1 t)\,dt \text{ and} \quad (19)$$

$$V''_k = \frac{2}{T}\int_0^T v(t)\cos(2\pi k f_1 t)\,dt. \quad (20)$$

In addition, one sees from equation (18) that $V'_k$ and $V''_k$, also represent amplitudes of voltage components that are in time-phase and in time-quadrature, respectively, with a reference zero-phase signal at frequency $f_k=kf_1$. Again, the timing of this reference signal, and hence the relative sizes of $V'_k$ and $V''_k$, is determined arbitrarily by the point in the periodic waveform v(t) that is chosen to be t=0 when evaluating equations (19) and (20).

The Fourier coefficient integrals, equations (16), (17), (19), and (20), can be approximated by well-known numerical techniques such as the Trapezoidal Rule. I have employed the Trapezoidal Rule to evaluate the four fundamental frequency Fourier coefficients $I'_1$, $I''_1$, $V'_1$ and $V''_1$ in terms of M samples of i(t) and of v(t) obtained at equally spaced times over one period. The results of these calculations are disclosed below in equations (21)–(32):

M=4: Samples taken at t=0; T/4; T/2; 3T/4.

$$I'_1=0.5\{i(T/4)-i(3T/4)\} \quad (21)$$

$$I''_1=0.5\{i(0)-i(T/2)\} \quad (22)$$

$$V'_1=0.5\{v(T/4)-v(3T/4)\} \quad (23)$$

$$V''_1=0.5\{v(0)-v(T/2)\} \quad (24)$$

M=8: Samples taken at t=0; T/8; T/4; 3T/8; T/2; 5T/8; 3T/4; 7T/8.

$$I'_1=0.17678\{i(T/8)-i(5T/8)+i(3T/8)-i(7T/8)\}+ \\ 0.25\{i(T/4)-i(3T/4)\} \quad (25)$$

$$I''_1=0.17678\{i(T/8)-i(5T/8)-i(3T/8)+i(7T/8)\}+ \\ 0.25\{i(0)-i(T/2)\} \quad (26)$$

$$V'_1=0.17678\{v(T/8)-v(5T/8)+v(3T/8)-v(7T/8)\}+ \\ 0.25\{v(T/4)-v(3T/4)\} \quad (27)$$

$$V''_1=0.17678\{v(T/8)-v(5T/8)-v(3T/8)+v(7T/8)\}+ \\ 0.25\{v(0)-v(T/2)\} \quad (28)$$

M=12: Samples taken at t=0; T/12; T/6; T/4; T/3; 5T/12; T/2; 7T/12; 2T/3; 3T/4; 5T/6; 11T/12.

$$I'_1=0.083333\{i(T/12)-i(7T/12)+i(5T/12)-i(11T/12)\}+ \\ 0.14434\{i(T/6)-i(2T/3)+i(T/3)-i(5T/6)\}+ \\ 0.16667\{i(T/4)-i(3T/4)\} \quad (29)$$

$$I''_1=0.083333\{i(T/6)-i(2T/3)-i(T/3)+i(5T/6)\}+ \\ 0.14434\{i(T/12)-i(7T/12)-i(5T/12)+i(11T/12)\}+ \\ 0.16667\{i(0)-i(T/2)\} \quad (30)$$

$$V'_1=0.083333\{v(T/12)-v(7T/12)+v(5T/12)-v(11T/12)\}+ \\ 0.14434\{v(T/6)-v(2T/3)+v(T/3)-v(5T/6)\}+ \\ 0.16667\{v(T/4)-v(3T/4)\} \quad (31)$$

$$V''_1=0.083333\{v(T/6)-v(2T/3)-v(T/3)+v(5T/6)\}+ \\ 0.14434\{v(T/12)-v(7T/12)-v(5T/12)+v(11T/12)\}+ \\ 0.16667\{v(0)-v(T/2)\} \quad (32)$$

In evaluating $I'_1$, $I''_1$, $V'_1$ and $V''_1$, any dc component of i(t) or v(t) cancels out due to the half-period symmetry of equation (15). Furthermore, noise signals not correlated with $\sin(2\pi f_1 t)$ and $\cos(2\pi f_1 t)$ will, on average, make equal positive and negative contributions to the integrals and can therefore be removed by averaging the Fourier coefficients over multiple periods as follows:

$$\langle I'_1\rangle_{av} = \frac{2}{nT}\int_0^{nT} i(t)\sin(2\pi f_1 t)\,dt \quad (33)$$

$$\langle I''_1\rangle_{av} = \frac{2}{nT}\int_0^{nT} i(t)\cos(2\pi f_1 t)\,dt \quad (34)$$

$$\langle V'_1\rangle_{av} = \frac{2}{nT}\int_0^{nT} v(t)\sin(2\pi f_1 t)\,dt \quad (35)$$

$$\langle V''_1\rangle_{av} = \frac{2}{nT}\int_0^{nT} v(t)\cos(2\pi f_1 t)\,dt \quad (36)$$

where n is an integer number of periods. However, since the Trapezoidal Rule numerical evaluations of equations (21)–(32) express linear relationships, the order of averaging and of summing can be interchanged $$(V'_1)_{av}=(a_1v(t_1)+a_2v(t_2)\dots)_{av}=a_1(v(t_1))_{av}+a_2(v(t_2))_{av}+\dots \quad (37)$$

Similar results apply to $(V''_1)_{av}$, $(I'_1)_{av}$, and $(I''_1)_{av}$. Accordingly, time-averaged Fourier coefficients can be very conveniently evaluated by simply averaging the sampled values themselves over multiple periods and then applying the appropriate four equations from equations (21)–(32) to the time-averaged data samples.

Once the averaged Fourier coefficients have been determined, the real and imaginary parts of complex admittance at the fundamental frequency $f_1$ follow by applying equations (12) and (13) with k=1.

$$G(f_1) = \frac{\langle I'_1\rangle_{av}\langle V'_1\rangle_{av} + \langle I''_1\rangle_{av}\langle V''_1\rangle_{av}}{\langle V'_1\rangle_{av}^2 + \langle V''_1\rangle_{av}^2} \text{ and} \quad (38)$$

$$B(f_1) = \frac{\langle I_1''\rangle_{av}\langle V_1'\rangle_{av} - \langle I_1'\rangle_{av}\langle V_1''\rangle_{av}}{\langle V_1'\rangle_{av}^2 + \langle V_1''\rangle_{av}^2} \qquad (39)$$

The point on the excitation and response waveforms chosen to be the t=0 sampling point determines the phase reference and therefore affects the relative sizes of $(I'_1)_{av}$, $(I''_1)_{av}$, $(V'_1)_{av}$ and $(V''_1)_{av}$. However, this arbitrary phase reference cancels out of equations (38) and (39) and therefore has little effect on the determination of $G(f_1)$ and $B(f_1)$. As long as the i(t) and v(t) sampling times are equally spaced over a period and the t=0 point is common to both i(t) and v(t) samples. The placement of the sampling times within a period is relatively immaterial.

My calculations have shown that the Trapezoidal Rule yields exact results if the Fourier series is appropriately terminated. For example, with M=4, I find that the Trapezoidal Rule gives exact results when the series is terminated after the first term. Accordingly, equations (21)–(24) are exact for pure sine wave excitation. However, when other frequencies are present in the excitation, the third (k=3) and higher order harmonics in the Fourier series will introduce error.

My calculations have disclosed the following general rule: When fundamental frequency Fourier coefficients are evaluated from M samples taken at equally spaced times over a period, the lowest order term in the Fourier series to cause error is of order (M−1). Thus, a third harmonic will cause error with M=4. With M=8, the third and fifth harmonics will have no effect but a seventh harmonic will introduce error. With M=12, error will only be introduced by the eleventh and higher-order harmonics. One sees that in order to obtain accurate results with a relatively small number of samples taken over a period, it is imperative that the higher-order harmonics be kept small.

One way of ensuring that higher-order harmonics are small is by proper choice of the excitation waveform, i(t). A pure sine wave is the best choice from a sampling point of view since exact results can then be obtained with only four samples taken per period. However, from a hardware point of view, pure sinusoidal excitation is not a very good choice since its implementation requires a distortion-free sine wave generator along with power-consuming linear amplification circuitry.

A better choice of excitation from a hardware standpoint is a symmetrical square wave. This waveform can be easily generated by simply using an active device, such as a mosfet or a bipolar transistor, as a controlled switch—turning the battery's load current, or its charging current, on and off with equal times spent in each state. Such a switched device dissipates virtually no power since it passes no current when it is in the "off" state and has nearly zero voltage across it when turned "on". Furthermore, the Fourier coefficients of a symmetrical square wave are proportional to 1/k where k is the harmonic index. Thus, higher-order harmonics are diminished naturally when using symmetrical square wave excitation.

A second way to improve accuracy is by using filters to attenuate higher-order harmonics. Such filters can be either of the low-pass type or of the band-pass type. Either type will attenuate higher-order harmonics and will thus increase measurement accuracy without requiring an increased number of samples per period. In addition, filters will also enhance noise immunity by rejecting out-of-band signals resulting from spurious currents flowing through the battery during measurement. From a noise immunity standpoint, a sharply tuned band-pass filter is generally superior to a simple low-pass filter.

Normally, one might expect that attenuation and phase shift introduced by a filter in the signal path would cause large errors. This might be especially true if the filter were a sharply tuned band-pass filter since both its attenuation and its phase shift vary rapidly with frequency over a very narrow range. I have determined, however, that such errors can be totally avoided by introducing the same filter characteristic into both the i(t) signal path and the v(t) signal path. Then, although the filter's attenuation and phase shift affect measured values of $(I'_1)_{av}$, $(I''_1)_{av}$, $(V'_1)_{av}$ and $(V''_1)_{av}$, such influences cancel out of the values of $G(f_1)$ and $B(f_1)$ determined from equations (38) and (39). This novel approach is an important contribution of my invention.

Figure 3:
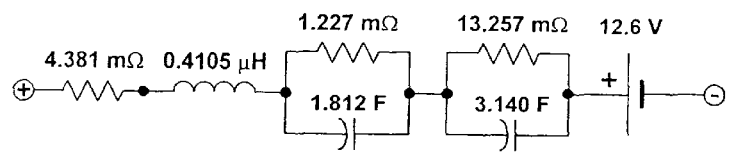
FIG. 3 is a schematic representation of a small-signal equivalent circuit model of a particular 12-volt automotive battery rated 800 cold-cranking amps.

The following mathematical simulations will demonstrate the efficacy of my measuring method. FIG. 3 is a schematic diagram representing a small-signal equivalent circuit model of a typical 12-volt lead-acid storage battery. The element values disclosed in FIG. 3 were obtained from measurements performed on an actual automotive battery rated 800 cold-cranking amperes. Using well-known formulas, one can calculate the complex admittance of the circuit of FIG. 3 at any given frequency. This admittance was calculated at 10 Hz and found to be Y(10)=G(10)+jB(10)=98.618+j61.877 Siemens.

Figure 4A:
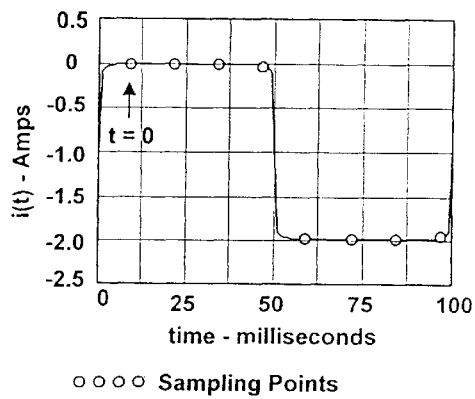
FIG. 4a is a waveform plot of the current of the battery depicted in FIG. 3 when it is subjected to a two ampere load current that is periodically switched "on" and "off" at a 10 Hz rate.

FIG. 4a discloses one period of a square-wave excitation current i(t) of the model of FIG. 3 resulting from periodically switching a 2 A load "on" and "off", with equal times spent in each state. The period T=100 ms corresponds to the fundamental frequency $f_1$=1/T=10 Hz. Since "on" and "off" times are equal, the square wave is symmetrical and has an average or dc value of −1 A. The time-varying response voltage of the battery model to this current excitation is disclosed in FIG. 4b.

Figure 4B:
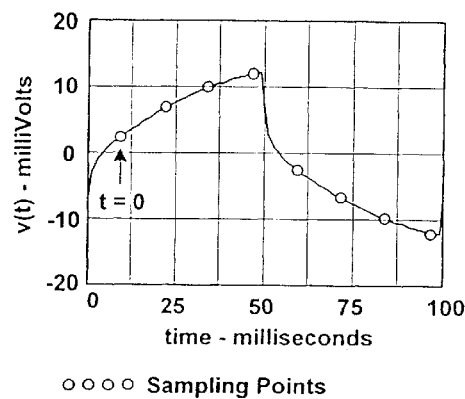

FIGS. 4a and 4b each disclose eight sampling times per period (M=8). In order to illustrate the phase insensitivity of the measurements, the first sampling time at t=0 is intentionally displaced from the square-wave switchover point by 8.33 ms, a 30° phase shift at the fundamental frequency $f_1$. The next seven sampling times then follow at 12.5 ms intervals, or every 45° at the fundamental frequency. The four fundamental frequency Fourier coefficients $(I'_1)_{av}$, $(I''_1)_{av}$, $(V'_1)_{av}$ and $(V''_1)_{av}$, were calculated from the sampled values of i(t) and v(t) shown in FIGS. 4a and 4b by using equations (25)–(28). The results are $\langle I'_1\rangle_{av}$=1.203 A $\langle I''_1\rangle_{av}$=0.507 A $\langle V'_1\rangle_{av}$=11.4 mV $\langle V''_1\rangle_{av}$=−0.854 mV These four quantities were combined in equations (38) and (39) to yield the complex admittance Y(10)=G(10)+jB(10)= 101.627+j52.069 Siemens. One sees that real and imaginary parts of admittance determined from the i(t) and v(t) samples differ by about 2.6% and 8.4%, respectively, from the true values calculated directly from the equivalent circuit model. Such errors, although not large, are the result of the seventh, and higher-order, harmonics being present in i(t) and v(t) waveforms. Measurement accuracy could therefore be improved by increasing the number of samples taken per period. It could also be improved by filtering.

Identical low-pass filter characteristics were next introduced into the i(t) and v(t) signal paths to attenuate the higher-order harmonics. Each filter characteristic was that of a simple, first-order, RC-type filter with cut-off frequency 10 Hz, the fundamental frequency of the excitation. Each low-pass filter therefore introduced 45° phase shift and 3 db attenuation at frequency $f_1$.

Figure 5A:
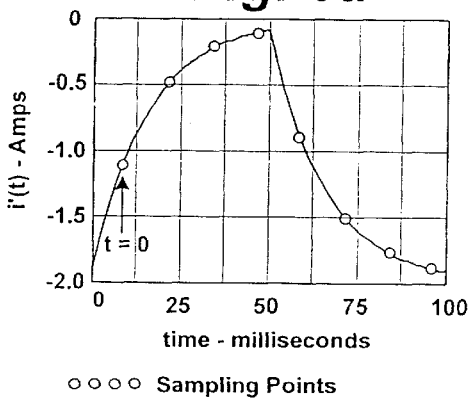
Figure 5B:
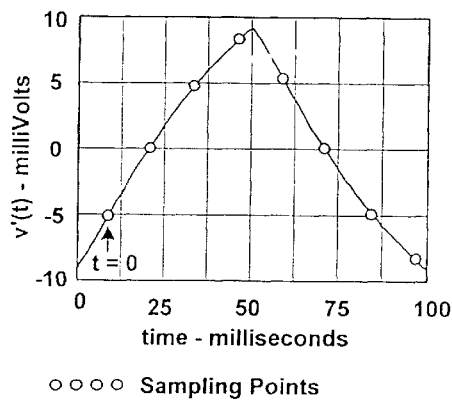
FIG. 5b is a waveform plot of the time-varying signal at the output of a low-pass filter whose input signal is the waveform depicted in FIG. 4b.

Current and voltage waveforms at the outputs of the low-pass filters, i'(t) and v'(t), are illustrated in FIGS. 5a and 5b, respectively. The average value of the current is again seen to be −1 A confirming the fact that the low-pass filter passes the dc component without attenuation. The eight sampling times indicated in each figure are the same as those disclosed in FIGS. 4a and 4b. The four fundamental frequency Fourier coefficients, $(I'_1)_{av}$, $(I''_1)_{av}$, $(V'_1)_{av}$ and $(V''_1)_{av}$, were again calculated from the sampled current and voltage by using equations (25)–(28). The results are $<I'_1>_{av}=0.868$ A $<I''_1>_{av}=-0.213$ A $<V'_1>_{av}=5.236$ mV $<V''_1>_{av}=-5.533$ mV which are quite different from those determined from the unfiltered voltage and current. However, when combined in equations (38) and (39) these coefficients yield $Y(10)=G(10)+jB(10)=98.608+j63.569$ Siemens whose real and imaginary parts now differ by only 0.01% and 1.5%, respectively, from the true values calculated directly from the equivalent circuit model. This large improvement in measurement accuracy dramatically illustrates the value of filtering i(t) and v(t) signals to remove higher-order harmonics prior to sampling the signals.

The low-pass filter characteristics were next replaced with second-order band-pass filter characteristics having bandwidths 1 Hz (i.e., Q=10). In order to illustrate the insensitivity of the measurements to tuning of the filters, the filters were intentionally "detuned" to 10.5 Hz, thus placing the fundamental frequency $f_1$ at the lower edge of the pass-band. Each filter therefore again introduced 45° phase shift and 3 dB attenuation at frequency $f_1$.

Figure 6A:
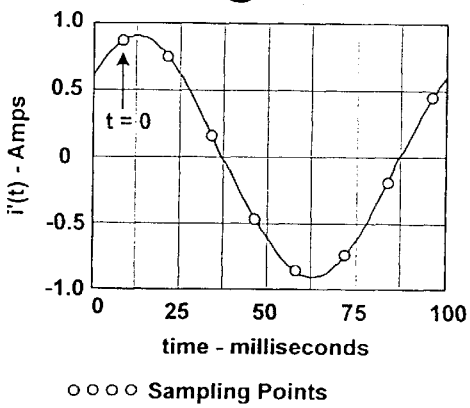
Figure 6B:
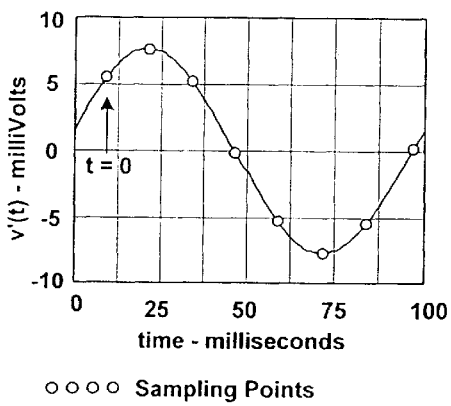
FIG. 6b is a waveform plot of the time-varying signal at the output of a band-pass filter whose input signal is the waveform depicted in FIG. 4b.

Current and voltage waveforms at the outputs of the band-pass filters, i'(t) and v'(t), are illustrated in FIGS. 6a and 6b, respectively. These waveforms appear to be sinusoids, thus indicating that the higher-order harmonics have been largely removed. The average value of the current waveform is now zero since the band-pass filter totally rejects the dc level. The eight sampling times indicated in each figure are again those disclosed in FIGS. 4a and 4b. Fourier coefficients, $(I'_1)_{av}$, $(I''_1)_{av}$, $(V'_1)_{av}$ and $(V''_1)_{av}$, were calculated from the sampled current and voltage by using equations (25)–(28). The results are $<I'_1>_{av}=0.209$ A $<I''_1>_{av}=0.864$ A $<V'_1>_{av}=5.525$ mV $<V''_1>_{av}=5.283$ mV which are quite different from those determined either from the unfiltered voltage and current or from the low-pass filtered voltage and current. However, combining these quantities in equations (38) and (39) yields $Y(10)=G(10)+jB(10)=98.813+j61.906$ Siemens. Real and imaginary parts now differ by only about 0.1% and 0.025%, respectively, from the true values calculated directly from the equivalent circuit model. Again, the effectiveness of filtering i(t) and v(t) signals to remove higher-order harmonics before sampling has been dramatically illustrated.

Figure 7:
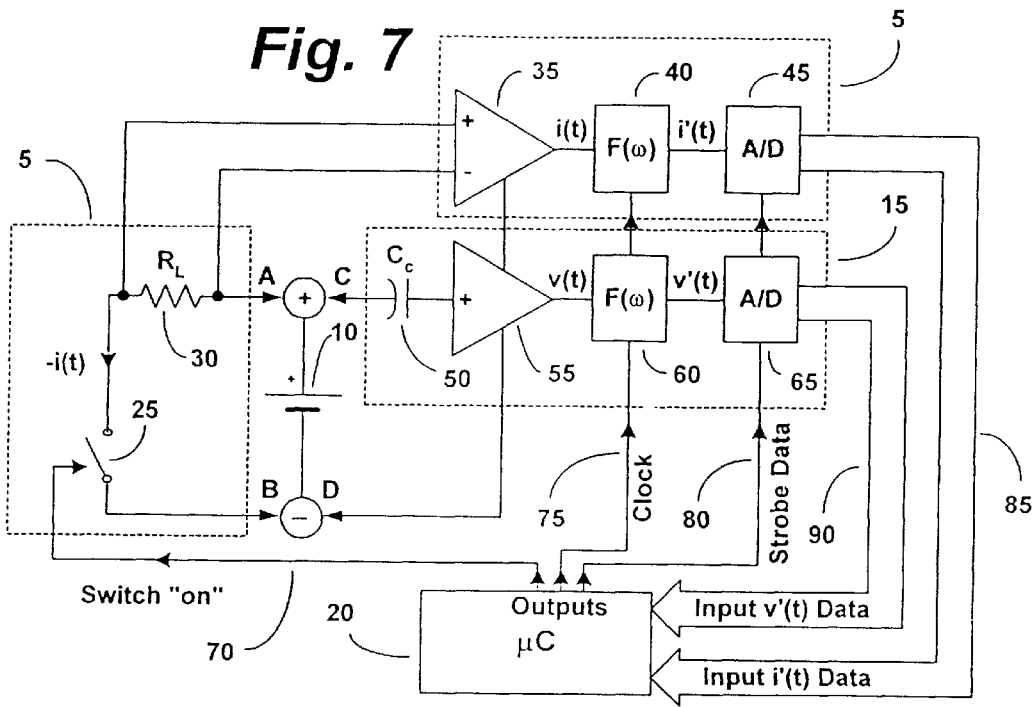
FIG. 7 depicts a block diagram of a first embodiment of measuring apparatus in accordance with the present invention.

FIG. 7 discloses a first embodiment of practical apparatus for measuring real and imaginary parts of complex admittance of cell/battery 10 according to the present invention. Current excitation and processing circuitry 5 of FIG. 1 comprises controlled switch 25, resistive load 30, differential voltage amplifier 35, current-signal filter 40, and analog to digital converter 45. Controlled switch 25 may comprise a mosfet, bipolar transistor, or other active device operated as a switch. Voltage sensing and processing circuitry 15 of FIG. 1 comprises coupling capacitor 50, voltage amplifier 55, voltage-signal filter 60, and analog to digital converter 65. Computation and control circuitry 20 of FIG. 1 simply comprises microprocessor/microcontroller 20.

The apparatus of FIG. 7 generates a periodic time-varying current i(t) through cell/battery 10 as follows: Using its internal clock as a primary timing reference, microprocessor/microcontroller 20 periodically commands controlled switch 25 to switch "on" via command line 70. This command is asserted for one-half period and is initiated every other half-period thereby generating a symmetrical square-wave current i(t) through cell/battery 10 via contacts A and B, controlled switch 25, and resistive load 30. FIG. 4a illustrates this waveform. Other techniques for generating a periodic excitation current under the timing control of microprocessor/microcontroller 20 will be apparent to one skilled in the art. An alternative would be for microprocessor/microcontroller 20 to periodically output appropriate digital words to digital-to-analog circuitry replacing controlled switch 25. In this fashion, virtually any periodic waveform, including a sine waveform, could be generated. However, as far as this embodiment of my invention is concerned, the features of importance are that the i(t) waveform be periodic, and that its timing be under the control of microprocessor/microcontroller 20.

Differential voltage amplifier 35 senses the voltage developed across resistive load 30 and outputs a signal that is proportional to i(t). This current signal passes through current-signal filter 40 which removes higher-order harmonics to produce a signal proportional to i'(t), the frequency-limited representation of i(t). Analog to digital converter 45 accepts the frequency-limited current signal as its input. Upon a "Strobe Data" command asserted by microprocessor/microcontroller 20 on command line 80, analog to digital converter 45 samples the instant value of i'(t) and converts this quantity to digital format. Microprocessor/microcontroller 20 subsequently inputs this digital i'(t) data via communication path 85.

Voltage amplifier 55 senses the voltage across cell/battery 10 at contacts C and D through coupling capacitor 50, which removes the dc component $V_0$. Accordingly, the output of voltage amplifier 55 is proportional to the ac response signal v(t). Voltage-signal filter 60 processes this signal and yields an output signal proportional to the frequency-limited voltage v'(t). The filter response characteristic of voltage-signal filter 60 is chosen to be identical to that of current-signal filter 40. Accordingly, as has been shown above, harmful effects resulting from the filters' attenuation and phase shift cancel out of the complex admittance determination.

Filters 40 and 60 may be either low-pass filters or band-pass filters and can be either of the switched-capacitor type, or of a more conventional type. If filters 40 and 60 are of the switched-capacitor type, their common cut-off or center frequency is determined by microprocessor/microcontroller 20 by virtue of the frequency of the clock signal outputted on command line 75. If more conventional active or passive filters are employed, the cut-off or center frequency is fixed and command line 75 is eliminated. Analog to digital converter 65 accepts the frequency-limited voltage signal v'(t) as its input. Upon a "Strobe Data" command asserted by microprocessor/microcontroller 20 on command line 80, analog to digital converter 45 samples the instant value of v'(t) and converts this quantity to digital format. Microprocessor/microcontroller 20 subsequently inputs the digital v'(t) data via communication path 90.

Microprocessor/microcontroller 20 asserts its "Strobe Data" line 80 at M equally spaced times between each successive time that it issues a command on line 70 to turn switch 25 "on". This effectively synchronizes the data samples to the excitation waveform. The sampled values of i'(t) and v'(t) are inputted into microprocessor/microcontroller 20 on data paths 85 and 90, respectively, and averaged over as many periods as are necessary to remove noise. Once stable noise-free averages have been obtained, microprocessor/microcontroller 20 calculates averaged Fourier coefficients $(I'_1)_{av}$, $(I''_1)_{av}$, $(V'_1)_{av}$ and $(V''_1)_{av}$ by applying the appropriate four equations such as those disclosed in equations (21)–(32). It then calculates real and imaginary parts of admittance by applying equations (38) and (39).

The invention embodiment of FIG. 7 acquires i'(t) and v'(t) data samples simultaneously. One disadvantage of this embodiment, however, is that its accuracy is critically dependent upon having a close match between the characteristics of the filters inserted into the current-signal and voltage-signal paths. This requirement is particularly troublesome when the two filters are narrow band band-pass filters. Such filters are difficult to match since both attenuation and phase shift change rapidly within a narrow frequency range.

Figure 8:
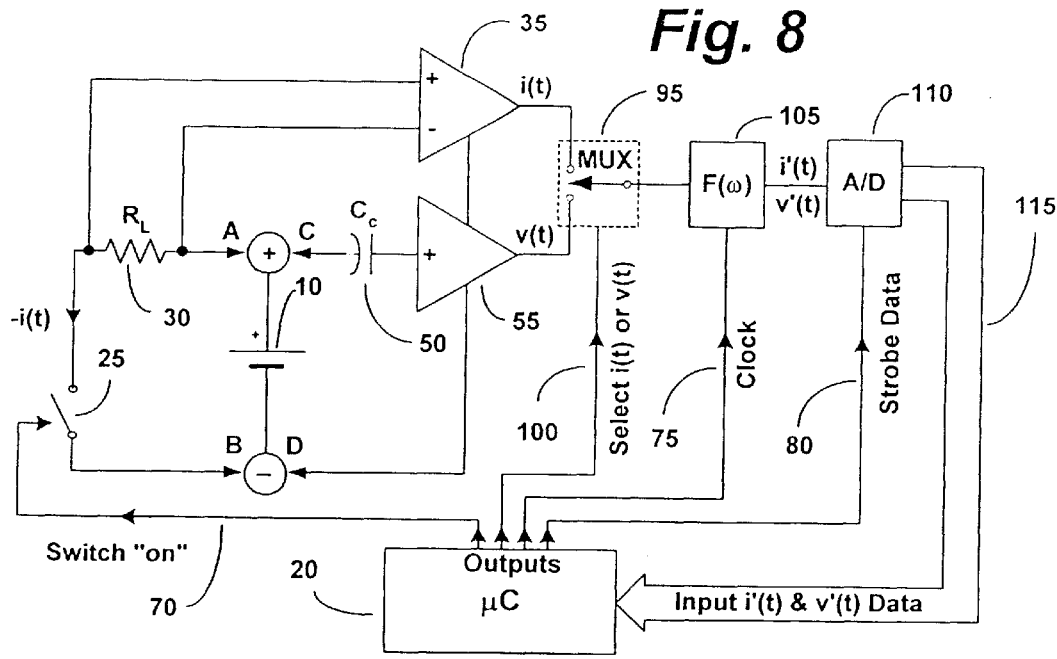
FIG. 8 depicts a block diagram of a second embodiment of measuring apparatus in accordance with the present invention.

FIG. 8 discloses a second embodiment of the invention that solves this problem. Instead of using separate filters in the current and voltage signal paths, a single filter 105 serves both functions. Microprocessor/microcontroller 20 selects the appropriate signal path for the filter by means of commands issued to analog multiplexer 95 on command line 100. Since the same filter is employed in both signal paths, the requirement of close matching is satisfied automatically. This second embodiment of FIG. 8 functions exactly the same as the first embodiment of FIG. 7 except that microprocessor/microcontroller 20 now also issues commands on line 100, and the i'(t) and v'(t) data samples are acquired sequentially during different periods rather than being acquired simultaneously.

Microprocessor/microcontroller 20 determines, under program control, the timing of the i(t) transitions and the timing of the acquisitions of the i'(t) and v'(t) data samples. If switched capacitor filters are employed in the current and voltage signal paths, microprocessor/microcontroller 20 also determines the filters' cut-off or center frequency. Accordingly, the apparatus when configured with switch-capacitor filters is completely software tunable and permits measuring complex admittance at any desired predetermined frequency over a wide range. However, when using filters having fixed response characteristics, the measurements will be limited to a more narrow frequency range.

The circuit disclosed in FIG. 9 helps to ameliorate this disadvantage of conventional filters. Filter block 120 contains a plurality of conventional filters, each having a different cut-off or center frequency. Microprocessor/microcontroller 20 selects a desired one of these fixed filters by issuing an appropriate command to analog multiplexer 125 on command line 130. In the example illustrated in FIG. 9, four conventional filters are disclosed. Thus, under software control, this apparatus is capable of measuring complex admittance of cell/battery 10 at four widely separated spot frequencies. However, the number four was simply chosen as an example. In practice, any number of fixed filters could be employed.

In all of the above embodiments, microprocessor/microcontroller 20 initiates the i(t) transitions and therefore naturally possesses the timing reference necessary for synchronizing the sampling times to the excitation waveform. An alternative way of accomplishing this objective is disclosed in FIG. 10. In this embodiment, the periodic current i(t) is generated externally to microprocessor/microcontroller 20 by a periodic signal source 135, which may comprise an actual function generator or may simply comprise the alternator of the battery's charging system. A timing reference is derived from i(t) by circuitry 140 that detects a particular periodically repeating point on the i(t) waveform. The resulting sequence of periodic timing pulses is communicated to microprocessor/microcontroller 20 on line 145 where it issues interrupts. A software routine servicing these interrupts initializes hardware or software timers to subsequently locate the M sampling times during each period. Thus, even though the excitation waveform is generated externally in the embodiment of FIG. 10, microprocessor/microcontroller 20 still possesses sufficient information to synchronize the sampling times to the excitation waveform.

A variation of this technique is disclosed in FIG. 11. In this figure, the battery is being charged from the ac mains by a battery charger comprising transformer 150 and rectifier 155. Circuitry 160 derives timing pulses from the ac power source by detecting zero crossings. A periodic sequence of timing pulses is again communicated to microprocessor/microcontroller 20 on line 145 where it issues interrupts. This invention variation permits measuring the battery's admittance at the power line frequency while it is being charged (or at twice this frequency with full-wave rectification) and takes advantage of the fact that my invention does not require the excitation to be sinusoidal—only periodic.

This completes the disclosure of my invention. The invention is very accurate, possesses high noise immunity, and is relatively inexpensive to implement. In summary, the steps leading to the evaluation of real and imaginary parts of complex admittance at frequency $f_1$ in accordance with my invention include one or more of the following:

Exciting the cell/battery with a periodic current i(t) that has a smallest period $1/f_1$ and provides a timing reference.

Sensing an i(t) signal and a responsive v(t) signal.

Processing both signals with identical frequency-limiting filters to obtain i'(t) and v'(t) signals.

Synchronously sampling the i'(t) and v'(t) signals at M equally spaced times over a period and converting the samples to digital format.

Averaging the digital samples over multiple periods to remove noise.

Evaluating averaged Fourier coefficients $(I'_1)_{av}$, $(I''_1)_{av}$, $(V'_1)_{av}$, and $(V''_1)_{av}$ from the averaged samples.

Numerically combining the averaged Fourier coefficients to determine $Y(f_1)=G(f_1)+jB(f_1)$.

The very high noise immunity of my invention permits measuring batteries while they are actually in use and results from two different factors. First, averaging the synchronously timed digital samples over multiple periods serves to cancel noise signals that are not correlated with $\sin(2\pi f_1 t)$ and $\cos(2\pi f_1 t)$ thus permitting small signals to be pulled out of considerable noise. Second, placing identical band-limiting filters in the i(t) and v(t) signal paths attenuates noise ever before the signals are sampled. Either one of these two techniques could be employed separately without departing from the true spirit and scope of my invention.

For example, one could make a crude approximation to admittance by simply detecting the peak or rms values of v(t) and i(t) and taking the ratio of detected values. If, however, this method were to employ the same band-limiting filter in both i(t) and v(t) signal paths: this crude approach would still fall within the purview of my invention. Similarly, one could simply leave out the filters and rely solely upon sampling/averaging to provide accuracy and noise immunity if the higher-order harmonics of the excitation waveform were sufficiently small. This variation would likewise fall within the purview of my invention. Furthermore, one could utilize my invention to evaluate only one of the two components of complex admittance or could express complex admittance in terms of magnitude and phase rather than real and imaginary parts. One could also take different numbers of samples M of the current signal and the voltage signal. Finally, signals having half-period symmetry (equation (15)) and no dc component need only be sampled during alternate half-periods rather than over full-period intervals. Workers skilled in the art will recognize that these and other variations may be made in form and detail without departing from the true spirit and scope of my invention.

What is claimed is:

1. Apparatus for evaluating admittance of an electrochemical cell or battery at a discrete frequency comprising:

current excitation circuitry adapted to be coupled to said cell or battery and adapted to pass a periodic current through said cell or battery, said periodic current characterized by a smallest period equal to the reciprocal of said discrete frequency;

current sensing and processing circuitry coupled to said current excitation circuitry and adapted to provide a current signal in response to said periodic current;

voltage sensing and processing circuitry coupled to said cell or battery and adapted to provide a voltage signal in response to a periodic voltage across said cell or battery;

current sampling and converting circuitry coupled to said current sensing and processing circuitry and adapted to provide digital representations of sampled values of said current signal, said sampled values obtained at discrete current sampling times synchronized with said periodic current and uniformly distributed in time over half-period or full-period intervals of said smallest period of said periodic current;

voltage sampling and converting circuitry coupled to said voltage sensing and processing circuitry and adapted to provide digital representations of sampled valves of said voltage signal, said sampled values obtained at discrete voltage sampling times synchronized with said periodic current and uniformly distributed in time over half-period or full-period intervals of said smallest period of said periodic current; and, computation and control circuitry coupled to said current excitation circuitry, to said current sampling and converting circuitry, and to said voltage sampling and converting circuitry, said computation and control circuitry adapted to initiate said current sampling times, to initiate said voltage sampling times, and to numerically combine said digital representations of said sampled values of said current signal and said digital representations of said sampled values of said voltage signal to evaluate said admittance.

2. Apparatus as in claim 1 wherein said current sensing and processing circuitry and said voltage sensing and processing circuitry include filtering circuitry adapted to process said current signal and said voltage signal with identical filter response functions.

3. Apparatus as in claim 2 wherein said filter response functions are low-pass filter response functions.

4. Apparatus as in claim 2 wherein said filter response functions are band-pass filter response functions.

5. Apparatus as in claim 1 wherein said computation and control circuitry is further adapted to initiate the timing of said periodic current and to identify said voltage sampling times and said current sampling times by measuring from a periodically repeating timing point of said periodic current.

6. Apparatus as in claim 5 wherein said current excitation circuitry includes a controlled switch and said computation and control circuitry initiates said timing of said periodic current by periodically turning said controlled switch on and off thereby periodically interrupting a current through said cell or battery.

7. Apparatus as in claim 1 wherein said current excitation circuitry includes function generating and timing circuitry adapted to spontaneously generate said periodic current and to communicate synchronous periodic timing pulses to said computation and control circuitry, said computation and control circuitry being adapted to identify said current sampling times and said voltage sampling times by measuring from said timing pulses.

8. Apparatus as in claim 7 wherein said function generating and timing circuitry includes an alternator for charging said cell or battery.

9. Apparatus as in claim 7 wherein said function generating and timing circuitry includes a transformer and rectifier for charging said cell or battery.

10. Apparatus as in claim 1 wherein said periodic current is a periodic square wave current.

11. Apparatus as in claim 1 wherein said periodic current is a periodic sine wave current.

12. Apparatus as in claim 1 wherein said computation and control circuitry is further adapted to average said digital representations of said sampled values of said current signal and said digital representations of said sampled values of said voltage signal to obtain averaged results, to numerically combine said averaged results to evaluate Fourier coefficients of components of said current signal and said voltage signal, and to numerically combine said Fourier coefficients to evaluate said admittance.

13. Apparatus for measuring admittance of an electrochemical cell or battery at a discrete frequency comprising:

current excitation circuitry adapted to be coupled to said cell or battery and adapted to pass a periodic current through said cell or battery, said periodic current characterized by a smallest period equal to the reciprocal of said discrete frequency;

current sensing circuitry coupled to said current excitation circuitry and adapted to produce a current signal proportional to said periodic current;

voltage sensing circuitry coupled to said cell or battery and adapted to produce a voltage signal proportional to a periodic voltage developed across said cell or battery;

filtering circuitry coupled to said current sensing circuitry and to said voltage sensing circuitry, said filtering circuitry characterized by a frequency response characteristic and adapted to provide a frequency-limited current signal in accordance with said frequency response characteristic and a frequency-limited voltage signal in accordance with the same said frequency response characteristic; and, evaluating circuitry coupled to said filtering circuitry and to said current excitation circuitry and adapted to provide values of said admittance of said electrochemical cell or battery in accordance with said frequency-limited current signal and said frequency-limited voltage signal.

14. Apparatus as in claim 13 wherein said evaluating circuitry comprises:
sampling and converting circuitry coupled to said filtering circuitry and adapted to provide digital representations of sampled values of said frequency-limited current signal and of said frequency-limited voltage signal, said sampled values obtained at periodically repeating sampling times synchronized to said periodic current and uniformly distributed over half-period or full-period intervals of said smallest period of said periodic current; and,
computation and control circuitry coupled to said current excitation circuitry and to said sampling and converting circuitry, said computation and control circuitry adapted to initiate said sampling times and to compute said admittance from said digital representations of said sampled values of said frequency-limited current signal and said frequency-limited voltage signal.

15. Apparatus as in claim 14 wherein said computation and control circuitry is further adapted to initiate the timing of said periodic current and to identify said sampling times by measuring from a periodically repeating timing point of said periodic current.

16. Apparatus as in claim 15 wherein said current excitation circuitry includes a controlled switch, and said computation and control circuitry initiates said timing of said periodic current by periodically turning said controlled switch on and off thereby periodically interrupting a current through said cell or battery.

17. Apparatus as in claim 14 wherein said current excitation circuitry includes function generating and timing circuitry adapted to spontaneously generate said periodic current and to communicate periodic timing pulses to said computation and control circuitry in synchronism with said periodic current, said computation and control circuitry being adapted to identify said sampling times by measuring from said periodic timing pulses.

18. Apparatus as in claim 17 wherein said function generating and timing circuitry includes an alternator for charging said cell or battery.

19. Apparatus as in claim 17 wherein said function generating and timing circuitry includes a transformer and rectifier for charging said cell or battery.

20. Apparatus as in claim 13 wherein said frequency response characteristic is a low-pass frequency response characteristic.

21. Apparatus as in claim 13 wherein said frequency response characteristic is a band-pass frequency response characteristic.

22. Apparatus as in claim 13 wherein said filtering circuitry comprises a pair of matched filter circuits adapted to separately provide said frequency-limited current signal and said frequency-limited voltage signal.

23. Apparatus as in claim 13 wherein said filtering circuitry comprises a single filter circuit adapted to provide both said frequency-limited current signal and said frequency-limited voltage signal.

24. Apparatus as in claim 13 wherein said periodic current is a periodic square wave current.

25. Apparatus as in claim 13 wherein said periodic current is a periodic sine wave current.

26. Apparatus as in claim 14 wherein said computation and control circuitry is further adapted to average said digital representations of said sampled values of said frequency-limited current signal and said frequency-limited voltage signal to obtain averaged results, to numerically combine said averaged results to evaluate Fourier coefficients of in-phase and quadrature components of said frequency-limited current signal and said frequency-limited voltage signal, and to numerically combine said Fourier coefficients to determine said admittance of said electrochemical cell or battery.

27. A method for measuring admittance of an electrochemical cell or battery at a discrete frequency comprising the steps of:
exciting said cell or battery with a periodic time-varying current characterized by a smallest period equal to the reciprocal of said discrete frequency;
sensing a current signal proportional to said periodic time-varying current and a voltage signal proportional to a time-varying response voltage across said cell or battery;
processing said current signal and said voltage signal with identical frequency response functions to obtain a frequency-limited current signal and a frequency-limited voltage signal; and,
combining said frequency-limited current signal and said frequency-limited voltage signal to determine said admittance of said electrochemical cell or battery.

28. A method as in claim 27 wherein said step of combining said frequency-limited current signal and said frequency-limited voltage signal further comprises steps of:
sampling said frequency-limited current signal and said frequency-limited voltage signal at uniformly spaced sampling times synchronized to said periodic time-varying current to obtain data samples and converting said data samples to digital format; and,
computing said admittance at said discrete frequency from said data samples converted to said digital format.

29. A method according to claim 28 wherein said step of computing further comprises the steps of
averaging said samples converted to digital format over multiple periods to obtain averaged digital samples;
evaluating Fourier coefficients of in-phase and quadrature components of said frequency-limited current signal and said frequency-limited voltage signal from said averaged digital samples; and,
combining said Fourier coefficients numerically to determine said admittance at said discrete frequency.

30. A method as in claim 27 wherein said step of exciting said cell or battery with a periodic time-varying current comprises exciting said cell or battery with a periodic square-wave current.

31. A method as in claim 27 wherein said step of exciting said cell or battery with a periodic time-varying current comprises exciting said cell or battery with a periodic sinusoidal current.

32. A method as in claim 27 wherein said step of processing said current signal and said voltage signal comprises processing said current signal and said voltage signal simultaneously, and said step of sampling said frequency-limited current signal and said frequency-limited voltage signal comprises sampling said frequency-limited current signal and said frequency-limited voltage signal simultaneously.

33. A method as in claim 27 wherein said step of processing said current signal and said voltage signal comprises processing said current signal and said voltage signal sequentially, and said step of sampling said frequency-limited current signal and said frequency-limited voltage signal comprises sampling said frequency-limited current signal and said frequency-limited voltage signal sequentially.

34. A method according to claim 27 wherein said step of processing said current signal and said voltage signal with identical frequency response functions comprises processing said current signal and said voltage signal with identical low-pass frequency response functions.

35. A method according to claim 27 wherein said step of processing said current signal and said voltage signal with identical frequency response functions comprises processing said current signal and said voltage signal with identical band-pass frequency response functions.

36. A method for measuring admittance of an electrochemical cell or battery at a discrete frequency comprising the steps of:
 exciting said cell or battery with a periodic time-varying current characterized by a smallest period equal to the reciprocal of said discrete frequency;
 forming a current signal in accordance with said periodic time-varying current and a voltage signal in accordance with a time-varying response voltage across said cell or battery;
 sampling said current signal and said voltage signal at equally spaced times over a half-period or full-period interval of said periodic time-varying current and converting sampled values of said current signal and sampled values of said voltage signal to digital format;
 averaging said sampled values over multiple periods to obtain averaged sampled values;
 evaluating Fourier coefficients from said averaged sample values; and,
 numerically combining said Fourier coefficients to determine said admittance of said electrochemical cell or battery at said discrete frequency.

37. A method as in claim 36 wherein said step of forming said current signal and said voltage signal includes processing said current signal and said voltage signal with identical low-pass frequency response functions.

38. A method as in claim 36 wherein said step of forming said current signal and said voltage signal includes processing said current signal and said voltage signal with identical band-pass frequency response functions.

39. A method as in claim 36 wherein said step of exciting said cell or battery with a periodic time-varying current comprises exciting said cell or battery with a periodic square-wave current.

40. A method as in claim 36 wherein said step of exciting said cell or battery with a periodic time-varying current comprises exciting said cell or battery with a periodic sinusoidal current.

41. An apparatus for measuring admittance of an electrochemical cell or battery at a discrete frequency adapted for performing the steps according to claim 27.

42. An apparatus for measuring admittance of an electrochemical cell or battery at a discrete frequency adapted for performing the steps according to claim 36.

43. Apparatus for evaluating a component of the complex admittance of an electrochemical cell or battery at a discrete frequency comprising:
 current excitation circuitry coupled to said cell or battery and adapted to pass a periodic excitation current through said cell or battery, said periodic excitation current characterized by a smallest period equal to the reciprocal of said discrete frequency;
 current sensing and processing circuitry coupled to said current excitation circuitry and adapted to provide a current signal in response to said periodic excitation current;
 voltage sensing and processing circuitry coupled to said cell or battery and adapted to provide a voltage signal in response to a periodic voltage across said cell or battery;
 current-signal sampling circuitry coupled to said current sensing and processing circuitry and adapted to provide sampled values of said current signal, said sampled values acquired at discrete current-signal sampling times synchronized with said periodic excitation current and uniformly distributed in time over half-period or full-period intervals of said smallest period of said periodic excitation current;
 voltage-signal sampling circuitry coupled to said voltage sensing and processing circuitry and adapted to provide sampled values of said voltage signal, said sampled values acquired at discrete voltage-signal sampling times synchronized with said periodic excitation current and uniformly distributed in time over half-period or full-period intervals of said smallest period of said periodic excitation current; and,
 computation and control circuitry coupled to said current-signal sampling circuitry and to said voltage-signal sampling circuitry and adapted to combine said sampled values of said current signal and said sampled values of said voltage signal to evaluate said component of said complex admittance at said discrete frequency.

44. Apparatus as in claim 43 wherein said periodic excitation current is a periodic square wave current.

45. Apparatus as in claim 43 wherein said periodic excitation current is a periodic sine wave current.

46. Apparatus as in claim 43 wherein the number of current-signal samples acquired per period and the number of voltage-signal samples acquired per period are equal.

47. Apparatus as in claim 43 wherein said current-signal samples and said voltage-signal samples are acquired coincidentally.

48. Apparatus as in claim 43 wherein said current-signal samples and said voltage-signal samples are acquired sequentially.

49. Apparatus as in claim 43 wherein said current sensing and processing circuitry and said voltage sensing and processing circuitry include filtering circuitry adapted to process said current signal and said voltage signal with identical filter response functions.

50. Apparatus as in claim 49 wherein said filter response functions are low-pass response functions.

51. Apparatus as in claim 49 wherein said filter response functions are band-pass response functions.

52. Apparatus as in claim 49 wherein said filtering circuitry comprises a pair of matched filter circuits adapted to separately process said current signal and said voltage signal.

53. Apparatus as in claim 49 wherein said filtering circuitry comprises a single filter circuit adapted to process both said current signal and said voltage signal.

54. Apparatus as in claim 43 wherein said computation and control circuitry is further coupled to said current excitation circuitry and is adapted to initiate the timing of said periodic excitation current, the timing of said current-signal sampling times, and the timing of said voltage-signal sampling times, said computation and control circuitry identifying said current-signal sampling times and said voltage-signal sampling times by measuring time from a periodically repeating timing point of said periodic excitation current.

55. Apparatus as in claim 54 wherein said current excitation circuitry includes a controlled switch and said computation and control circuitry initiates said timing of said periodic excitation current by periodically turning said controlled switch on and off thereby periodically interrupting a current through said cell or battery.

56. Apparatus as in claim 54 wherein said current excitation circuitry includes digital-to-analog circuitry and said computation and control circuitry initiates said timing of said periodic excitation current by periodically outputting appropriate digital data to said digital-to-analog circuitry.

57. Apparatus as in claim 43 wherein said current excitation circuitry includes function generating and timing circuitry adapted to spontaneously generate said periodic excitation current and to communicate synchronous periodic timing pulses to said computation and control circuitry, said computation and control circuitry being adapted to identify said current-signal sampling times and said voltage-signal sampling times by measuring time from said timing pulses.

58. Apparatus as in claim 57 wherein said function generating and timing circuitry includes an alternator for charging said cell or battery.

59. Apparatus as in claim 57 wherein said function generating and timing circuitry includes a transformer and rectifier for charging said cell or battery.

60. Apparatus as in claim 43 wherein said computation and control circuitry is further adapted to average said sampled values of said current signal and to average said sampled values of said voltage signal to obtain averaged (current signal and voltage signal samples, to numerically combine said averaged current signal and voltage signal samples to evaluate averaged Fourier coefficients, and to numerically combine said averaged Fourier coefficients to evaluate said component of said complex admittance at said discrete frequency.

61. Apparatus for measuring at least one component of the complex admittance of an electrochemical cell or battery at a discrete frequency comprising:

current excitation circuitry coupled to said cell or battery and adapted to pass a periodic excitation current through said cell or battery, said periodic excitation current characterized by a smallest period equal to the reciprocal of said discrete frequency;

current sensing circuitry coupled to said current excitation circuitry and adapted to produce a current signal proportional to said periodic excitation current;

voltage sensing circuitry coupled to said cell or battery and adapted to produce a voltage signal proportional to a periodic voltage developed across said cell or battery;

filtering circuitry coupled to said current sensing circuitry and to said voltage sensing circuitry, said filtering circuitry characterized by a complex transfer function and adapted to provide a frequency-limited current signal in accordance with said complex transfer function and a frequency-limited voltage signal in accordance with the same said complex transfer function; and, evaluating circuitry coupled to said filtering circuitry and to said current excitation circuitry and adapted to evaluate at least one component of said complex admittance of said electrochemical cell or battery in accordance with said frequency-limited current signal, said frequency-limited voltage signal, and said periodic excitation current.

62. Apparatus as in claim 61 wherein said periodic excitation current is a periodic square wave current.

63. Apparatus as in claim 61 wherein said periodic excitation current is a periodic sine wave current.

64. Apparatus as in claim 61 wherein said complex transfer function is a band-pass transfer function.

65. Apparatus as in claim 61 wherein said complex transfer function is a low-pass transfer function.

66. Apparatus as in claim 61 wherein said filtering circuitry comprises a pair of matched filter circuits adapted to separately provide said frequency-limited current signal and said frequency-limited voltage signal.

67. Apparatus as in claim 61 wherein said filtering circuitry comprises a single filter circuit adapted to provide both said frequency-limited current signal and said frequency-limited voltage signal.

68. Apparatus as in claim 61 wherein said evaluating circuitry comprises:

sampling and converting circuitry coupled to said filtering circuitry and adapted to provide digital representations of sampled values of said frequency-limited current signal and of said frequency-limited voltage signal, said sampled values acquired at periodically repeating sampling times synchronized with said periodic excitation current and uniformly distributed over half-period or full-period intervals of said smallest period of said periodic excitation current; and, computation and control circuitry coupled to said current excitation circuitry and to said sampling and converting circuitry, said computation and control circuitry adapted to initiate said sampling times and to compute at least one component of said complex admittance from said digital representations of said sampled values of said frequency-limited current signal and said frequency-limited voltage signal.

69. Apparatus as in claim 68 wherein the number of current-signal samples acquired per period and the number of voltage-signal samples acquired per period are equal.

70. Apparatus as in claim 69 wherein said current-signal samples and said voltage-signal samples are acquired coincidentally.

71. Apparatus as in claim 68 wherein said current-signal samples and said voltage-signal samples are acquired sequentially.

72. Apparatus as in claim 68 wherein said computation and control circuitry is further adapted to initiate the timing of said periodic excitation current and to identify said sampling times by measuring from a periodically repeating timing point of said periodic excitation current.

73. Apparatus as in claim 72 wherein said current excitation circuitry includes a controlled switch, and said computation and control circuitry initiates said timing of said periodic excitation current by periodically turning said controlled switch on and off thereby periodically interrupting a current through said cell or battery.

74. Apparatus as in claim 72 wherein said current excitation circuitry includes digital-to-analog circuitry and said computation and control circuitry initiates said timing of said periodic excitation current by periodically outputting appropriate digital data to said digital-to-analog circuitry.

75. Apparatus as in claim 68 wherein said current excitation circuitry includes function generating and timing circuitry adapted to spontaneously generate said periodic excitation current and to communicate periodic timing pulses to said computation and control circuitry in synchronism with said periodic excitation current, said computation and control circuitry being adapted to identify said sampling times by measuring from said periodic timing pulses.

76. Apparatus as in claim 75 wherein said function generating and timing circuitry includes an alternator for charging said cell or battery.

77. Apparatus as in claim 75 wherein said function generating and timing circuitry includes a transformer and rectifier for charging said cell or battery.

78. Apparatus as in claim 68 wherein said computation and control circuitry is further adapted to average said digital representations of said sampled values of said frequency-limited current signal and to average said digital representations of said sampled values of said frequency-limited voltage signal to obtain averaged current signal samples and averaged voltage signal samples, to numerically combine said averaged current signal samples and averaged voltage signal samples to evaluate averaged Fourier coefficients, and to numerically combine said averaged Fourier coefficients to evaluate at least one component of said complex admittance of said electrochemical cell or battery at said discrete frequency.

79. A method for measuring a component of complex admittance of an electrochemical cell or battery at a discrete frequency comprising:

exciting said cell or battery with a periodic time-varying current characterized by a smallest period equal to the reciprocal of said discrete frequency;

forming a current signal proportional to said periodic time-varying current and a voltage signal proportional to a time-varying response voltage across said cell or battery;

processing said current signal and said voltage signal with the same complex transfer function to obtain a frequency-limited current signal and a frequency-limited voltage signal; and, combining said frequency-limited current signal and said frequency-limited voltage signal to determine said component of complex admittance of said electrochemical cell or battery at said discrete frequency.

80. A method as in claim 79 wherein said step of combining said frequency-limited current signal and said frequency-limited voltage signal further comprises:

sampling said frequency-limited current signal and said frequency-limited voltage signal at uniformly spaced sampling times synchronized to said periodic time-varying current to acquire data samples and converting said data samples to digital format; and, computing said component of complex admittance at said discrete frequency from said data samples converted to said digital format.

81. A method according to claim 80 wherein said step of computing further comprises:

averaging said samples converted to digital format over multiple periods to obtain averaged digital samples;

evaluating averaged Fourier coefficients of in-phase and quadrature components of said frequency-limited current signal and said frequency-limited voltage signal from said averaged digital samples; and, combining said averaged Fourier coefficients numerically to determine said component of said complex admittance at said discrete frequency.

82. A method as in claim 79 wherein said step of exciting said cell or battery with a periodic time-varying current comprises exciting said cell or battery with a periodic square-wave current.

83. A method as in claim 79 wherein said step of exciting said cell or battery with a periodic time-varying current comprises exciting said cell or battery with a periodic sinusoidal current.

84. A method as in claim 79 wherein said step of processing said current signal and said voltage signal comprises processing said current signal and said voltage signal simultaneously, and said step of sampling said frequency-limited current signal and said frequency-limited voltage signal comprises sampling said frequency-limited current signal and said frequency-limited voltage signal simultaneously.

85. A method as in claim 79 wherein said step of processing said current signal and said voltage signal comprises processing said current signal and said voltage signal sequentially, and said step of sampling said frequency-limited current signal and said frequency-limited voltage signal comprises sampling said frequency-limited current signal and said frequency-limited voltage signal sequentially.

86. A method according to claim 79 wherein said step of processing said current signal and said voltage signal with the same complex transfer function comprises processing said current signal and said voltage signal with the same complex low-pass transfer function.

87. A method according to claim 79 wherein said step of processing said current signal and said voltage signal with the same complex transfer function comprises processing said current signal and said voltage signal with the same complex band-pass transfer function.

88. A method for measuring at least one component of complex admittance of an electrochemical cell or battery at a discrete frequency comprising:

exciting said cell or battery with a periodic time-varying current characterized by a smallest period equal to the reciprocal of said discrete frequency;

forming a current signal in accordance with said periodic time-varying current and a voltage signal in accordance with a time-varying response voltage across said cell or battery;

sampling said current signal and said voltage signal at equally spaced times over a half-period or full-period interval of said periodic time-varying current and converting sampled values of said current signal and sampled values of said voltage signal to digital format;

averaging said sampled values over multiple periods to obtain averaged sampled values;

evaluating Fourier coefficients from said averaged sample values; and, numerically combining said Fourier coefficients to determine at least one component of said complex admittance of said electrochemical cell or battery at said discrete frequency.

89. A method as in claim 88 wherein said step of forming said current signal and said voltage signal includes processing said current signal and said voltage signal with identical low-pass frequency response functions.

90. A method as in claim 88 wherein said step of forming said current signal and said voltage signal includes processing said current signal and said voltage signal with identical band-pass frequency response functions.

91. A method as in claim 88 wherein said step of exciting said cell or battery with a periodic time-varying current comprises exciting said cell or battery with a periodic square-wave current.

92. A method as in claim 88 wherein said step of exciting said cell or battery with a periodic time-varying current comprises exciting said cell or battery with a periodic sinusoidal current.

93. An apparatus for measuring a component of complex admittance of an electrochemical cell or battery at a discrete frequency adapted for performing the steps according to claim 79.

94. An apparatus for measuring at least one component of complex admittance of an electrochemical cell or battery at a discrete frequency adapted for performing the steps according to claim 88.

* * * * *

UNITED STATES PATENT AND TRADEMARK OFFICE
CERTIFICATE OF CORRECTION

PATENT NO. : 6,262,563 B1  
DATED : July 17, 2001  
INVENTOR(S) : Champlin

It is certified that error appears in the above-identified patent and that said Letters Patent is hereby corrected as shown below:

Column 5,  
Replace equation 16 with the following:

$$-- \quad I'_k = \frac{2}{T} \int_0^T i(t) \sin(2\pi k f_1 t) dt \qquad (16) \quad \text{and} --$$

Replace equation 19 with the following:

$$-- \quad V'_k = \frac{2}{T} \int_0^T v(t) \sin(2\pi k f_1 t) dt \qquad (19) \quad \text{and} --$$

Column 6,  
Replace equation 37 with the following:

$$-- \quad \langle V'_1 \rangle_{av} = \langle a_1 v(t_1) + a_2 v(t_2) \cdots \rangle_{av} = a_1 \langle v(t_1) \rangle_{av} + a_2 \langle v(t_2) \rangle_{av} + \cdots \quad --$$

Line 53, replace " $(V''_1)_{av}$, $(I'_1)_{av}$, and $(I''_1)_{av}$ " with  
$-- \langle V''_1 \rangle_{av}$, $\langle I'_1 \rangle_{av}$, and $\langle I''_1 \rangle_{av} --$.

Column 7,  
Lines 8-9, replace " $(I'_1)_{av}$, $(I''_1)_{av}$, $(V'_1)_{av}$ and $(V''_1)_{av}$ " with  
$-- \langle I'_1 \rangle_{av}$, $\langle I''_1 \rangle_{av}$, $\langle V'_1 \rangle_{av}$ and $\langle V''_1 \rangle_{av} --$.

UNITED STATES PATENT AND TRADEMARK OFFICE
CERTIFICATE OF CORRECTION

PATENT NO. : 6,262,563 B1
DATED : July 17, 2001
INVENTOR(S) : Champlin

It is certified that error appears in the above-identified patent and that said Letters Patent is hereby corrected as shown below:

<u>Column 8,</u>
Line 12, replace

"$(I'_1)_{av}, (I''_1)_{av}, (V'_1)_{av}$ and $(V''_1)_{av}$" with
-- $\langle I'_1 \rangle_{av}, \langle I''_1 \rangle_{av}, \langle V'_1 \rangle_{av}$ and $\langle V''_1 \rangle_{av}$ --.

Lines 43-44, replace

"$(I'_1)_{av}, (I''_1)_{av}, (V'_1)_{av}$ and $(V''_1)_{av}$" with
-- $\langle I'_1 \rangle_{av}, \langle I''_1 \rangle_{av}, \langle V'_1 \rangle_{av}$ and $\langle V''_1 \rangle_{av}$ --.

<u>Column 9,</u>
Lines 12-13, replace

"$(I'_1)_{av}, (I''_1)_{av}, (V'_1)_{av}$ and $(V''_1)_{av}$" with
-- $\langle I'_1 \rangle_{av}, \langle I''_1 \rangle_{av}, \langle V'_1 \rangle_{av}$ and $\langle V''_1 \rangle_{av}$ --.

Line 48, replace

"$(I'_1)_{av}, (I''_1)_{av}, (V'_1)_{av}$ and $(V''_1)_{av}$" with
-- $\langle I'_1 \rangle_{av}, \langle I''_1 \rangle_{av}, \langle V'_1 \rangle_{av}$ and $\langle V''_1 \rangle_{av}$ --.

<u>Column 11,</u>
Line 18, replace

"$(I'_1)_{av}, (I''_1)_{av}, (V'_1)_{av}$ and $(V''_1)_{av}$" with
-- $\langle I'_1 \rangle_{av}, \langle I''_1 \rangle_{av}, \langle V'_1 \rangle_{av}$ and $\langle V''_1 \rangle_{av}$ --.

UNITED STATES PATENT AND TRADEMARK OFFICE
CERTIFICATE OF CORRECTION

PATENT NO.   : 6,262,563 B1
DATED        : July 17, 2001
INVENTOR(S)  : Champlin It is certified that error appears in the above-identified patent and that said Letters Patent is hereby corrected as shown below:

Column 12,
Lines 57-58, replace

" $(I'_1)_{av}$, $(I''_1)_{av}$, $(V'_1)_{av}$ and $(V''_1)_{av}$ " with

-- $\langle I'_1 \rangle_{av}$, $\langle I''_1 \rangle_{av}$, $\langle V'_1 \rangle_{av}$ and $\langle V''_1 \rangle_{av}$ --.

Column 13,
Line 52, replace "valves" with -- values --.

Column 19,
Line 26, delete "(".

Signed and Sealed this

Twentieth Day of August, 2002

Attest:

JAMES E. ROGAN
Attesting Officer            Director of the United States Patent and Trademark Office